(12) United States Patent
Damien (10) Patent No.: US 7,978,502 B2
(45) Date of Patent: Jul. 12, 2011

(54) METHOD OF PROGRAMMING A MEMORY DEVICE OF THE ONE-TIME PROGRAMMABLE TYPE AND INTEGRATED CIRCUIT INCORPORATING SUCH A MEMORY

(75) Inventor: Joel Damien, La Motte Servolex (FR)

(73) Assignee: STMicroelectronics S.A., Montrouge (FR)

( * ) Notice: Subject to any disclaimer, the term of this patent is extended or adjusted under 35 U.S.C. 154(b) by 177 days.

(21) Appl. No.: 12/415,299

(22) Filed: Mar. 31, 2009

(65) Prior Publication Data

US 2009/0251942 A1    Oct. 8, 2009

(30) Foreign Application Priority Data

Apr. 8, 2008 (FR) .................................... 08 52354

(51) Int. Cl.
*G11C 11/24* (2006.01)
(52) U.S. Cl. ............. 365/149; 365/94; 365/96; 365/102
(58) Field of Classification Search .................... 365/94, 365/96, 189.16, 225.7, 149, 102
See application file for complete search history.

(56) References Cited

U.S. PATENT DOCUMENTS

| 6,016,268 A * | 1/2000 | Worley ......................... 365/149 |
| 2002/0027822 A1* | 3/2002 | Candelier et al. .......... 365/225.7 |
| 2008/0074915 A1* | 3/2008 | Terzioglu et al. ............... 365/96 |
| 2008/0117660 A1* | 5/2008 | Xu et al. ........................ 365/96 |

FOREIGN PATENT DOCUMENTS

| EP | 1 351 255 | 10/2003 |
| EP | 1 583 239 | 10/2005 |
| JP | 59-87697 | 5/1984 |
| WO | WO 2006/017416 | 2/2006 |
| WO | WO 2007/040847 | 4/2007 |

OTHER PUBLICATIONS

Preliminary French Search Report, FR 0852354, dated Oct. 31, 2008.
Barsatan, Randy et al., "A Zero-Mask One-Time Programmable Memory Array for RFID Applications", 0-7803-9390-2/06/$20.00, 2006, IEEE, pp. 975-978.
Candelier, Philippe et al., "One Time Programmable Drift Antifuse Cell Reliability", IEEE 00CH37059, 38th Annual International Reliability Physics Symposium, San Jose, California, 2000, pp. 169-173.
Kim, Jinbong et al., "Three-Transistor One-Time Programmable (OTP) ROM Cell Array Using Standard CMOS Gate Oxide Antifuse", 0741-3106/03$17.00, 2003, IEEE, pp. 589-591.

* cited by examiner

*Primary Examiner* — Tuan T Nguyen
*Assistant Examiner* — Toan Le
(74) *Attorney, Agent, or Firm* — Andre M. Szuwalski; Gardere Wynne & Sewell LLP (57) ABSTRACT

A memory device of the irreversibly electrically programmable type is provided with a memory cell having a dielectric zone disposed between a first electrode and second electrode. An access transistor is connected in series with the second electrode, and an auxiliary transistor is connected in series with the first electrode. The auxiliary transistor is biased to have a saturation current which is lower than a saturation current of the access transistor when both the auxiliary and access transistors are actuated. A number of the memory cells are arranged in a memory plane to form the memory device.

23 Claims, 7 Drawing Sheets

METHOD OF PROGRAMMING A MEMORY DEVICE OF THE ONE-TIME PROGRAMMABLE TYPE AND INTEGRATED CIRCUIT INCORPORATING SUCH A MEMORY

PRIORITY CLAIM

The present application claims priority from French Application for Patent No. 08 52354 filed Apr. 8, 2008, the disclosure of which is hereby incorporated by reference.

BACKGROUND OF THE INVENTION

1. Technical Field of the Invention

The present invention relates to integrated circuits, and in particular integrated memory devices of the "One-Time Programmable" type, also known as "OTP" memories.

2. Description of Related Art

The OTP memory is well known to the person skilled in the art. It comprises fusible elements, such as capacitors, that are "blown" electrically, that is to say the dielectric of the capacitor is electrically impaired in an irreversible manner, so that the latter then behaves as a resistance of small value.

The reliability of memory cells in programming mode is a significant element. This reliability is affected, as regards the cells not selected during programming, by the stresses on the gate oxide of the access transistor of the memory cell. These stresses may be tolerated on MOS access transistors of the "field gradient" type (also known as "drift transistors").

These stresses may also be limited using access devices forming cascode arrangements or else using high-voltage switches disposed in parallel with the word lines of the memory.

As regards the cells selected during programming, their reliability is affected by the phenomenon of hot carrier degradation.

This reliability problem arises in particular for CMOS technologies at 65 nanometers and less, by virtue in particular of the strong current passing through the access transistor exhibiting a strong drain/source voltage. A solution for reducing this strong current consists in using access transistors having significant channel lengths, but this has a negative impact on the surface area of the memory cell.

Another solution consists in reducing the programming voltage but this has a negative impact on the programming duration.

Moreover, it is currently difficult to detect the actual instant of programming, that is to say the moment at which the dielectric zone has actually been "blown". So, a sufficiently long programming duration is currently fixed, on completion of which it is considered that the programming of the cell has actually taken place in a quasi certain manner. However, it turns out that this duration is not optimized since in most cases, the impairment of the dielectric has taken place well before the expiry of this duration.

SUMMARY OF THE INVENTION

According to an embodiment and mode of implementation, there is proposed a method and an integrated circuit making it possible to improve the reliability of the access transistor of a memory cell in the course of programming, when this memory cell is actually selected.

According to another embodiment and mode of implementation, there is also proposed a method and an integrated circuit allowing more precise detection of the actual instant of programming of a memory cell.

According to one aspect, there is proposed an integrated circuit comprising a memory device of the irreversibly electrically programmable type comprising at least one memory cell comprising a dielectric zone disposed between a first electrode electrically coupled to a first power supply terminal, for example intended to receive a programming voltage, and a second electrode electrically coupled to an access circuit including at least one access transistor.

According to a general characteristic of this aspect, the memory device furthermore comprises an auxiliary circuit comprising an auxiliary transistor electrically coupled between the first electrode and the first power supply terminal, able to be controlled on its auxiliary control electrode in such a way as to be enabled when the access circuit is enabled, and arranged in such a way as to exhibit a lower saturation current than the saturation current of the access circuit.

Thus, the current flowing in the memory cell during programming is equal to the saturation current of the auxiliary transistor, which is lower than the saturation current of the access circuit. Moreover, the drain/source voltage of the access transistor or transistors of the memory cell is lower than the saturation drain/source voltage which is itself lower than the nominal drain/source voltage. Therefore, the access transistor or transistors operate in a nominal span and their reliability is thus improved.

It should be noted that for ease of programming control, in particular on memory planes, the auxiliary transistor may be enabled before the cell is actually selected, that is to say before the access circuit itself is enabled.

According to an embodiment, the memory device furthermore comprises detection means electrically coupled to the auxiliary transistor and able to detect a degradation of the dielectric zone of the memory cell during irreversible programming of said memory cell.

According to an embodiment, the auxiliary transistor comprises a first auxiliary electrode electrically coupled to said first power supply terminal and a second auxiliary electrode electrically coupled to the first electrode, and the detection means are able to detect a voltage variation at a spot situated between the second auxiliary electrode and the first electrode.

According to an embodiment, the memory device furthermore comprises a bias circuit, electrically coupled to the auxiliary control electrode, and comprising a first transistor, identical to the access transistor, a second transistor electrically coupled between the first transistor and the first power supply terminal and forming with the auxiliary transistor a current mirror, the ratio W/L of this second transistor being greater than the ratio W/L of the auxiliary transistor, W and L respectively designating the width and the length of the channel of the transistor.

Such an embodiment makes it readily possible to obtain a lower saturation current of the auxiliary transistor than the saturation current of the access transistor.

So as to further improve reliability, in particular that of the auxiliary transistor, as well as in order, as appropriate, to increase the precision in the copying of currents, it is particularly advantageous to use cascode arrangements.

Thus, according to an embodiment, the auxiliary circuit furthermore comprises a first additional transistor electrically coupled between the auxiliary transistor and the first electrode and forming with the auxiliary transistor a first cascode arrangement. The bias circuit furthermore comprises a second additional transistor electrically coupled between the first transistor and the second transistor and forming with the first transistor a second cascode arrangement.

The use of an auxiliary circuit such as mentioned hereinabove, is compatible with any organization of memory plane and any type of programming of the memory plane.

Thus, in an embodiment in which the memory device comprises a memory plane comprising first sets of memory cells, for example rows of memory cells, extending in a first direction and second sets of memory cells, for example columns of memory cells, extending in a second direction, all the first electrodes of the memory cells being electrically coupled to the power supply terminal, the auxiliary circuit can be common to all the columns of memory cells, thereby allowing for example bitwise programming.

As a variant, there may be provided one auxiliary circuit per column of memory cells and a single bias circuit for all the auxiliary circuits. This allows programming by words of several bits.

It is also possible, when the columns are grouped together into groups, for example into pairs, to provide one auxiliary circuit per group of columns, and a single bias circuit for all the auxiliary circuits.

According to another aspect, there is also proposed a method of programming a memory device of the irreversibly electrically programmable type comprising at least one memory cell comprising a dielectric zone electrically coupled to an access circuit including at least one access transistor.

According to a general characteristic of this other aspect, a programming voltage is applied to the dielectric zone across an auxiliary transistor in its enabled state, the saturation current of the auxiliary transistor being lower than the saturation current of the access circuit.

According to a mode of implementation, a degradation is detected of the dielectric zone of the memory cell during irreversible programming of the memory cell, for example by detecting the voltage variation at a spot situated between the auxiliary transistor and the dielectric zone.

In an embodiment, an integrated circuit comprises: a capacitive structure including a first and second plates with a dielectric situated between the first and second plates; an access transistor having a conduction path connected in series with the capacitive structure at the second plate; an auxiliary transistor having a conduction path connected in series with the capacitive structure at the first plate; and a bias circuit which biases the auxiliary transistor to have a first saturation current that is less than a second saturation current for the access transistor.

BRIEF DESCRIPTION OF THE DRAWINGS

Other advantages and characteristics of the invention will become apparent on examining the detailed description of modes of implementation and embodiments, wholly non-limiting, and the appended drawings in which.

DETAILED DESCRIPTION OF THE PREFERRED EMBODIMENTS

Figure 1:
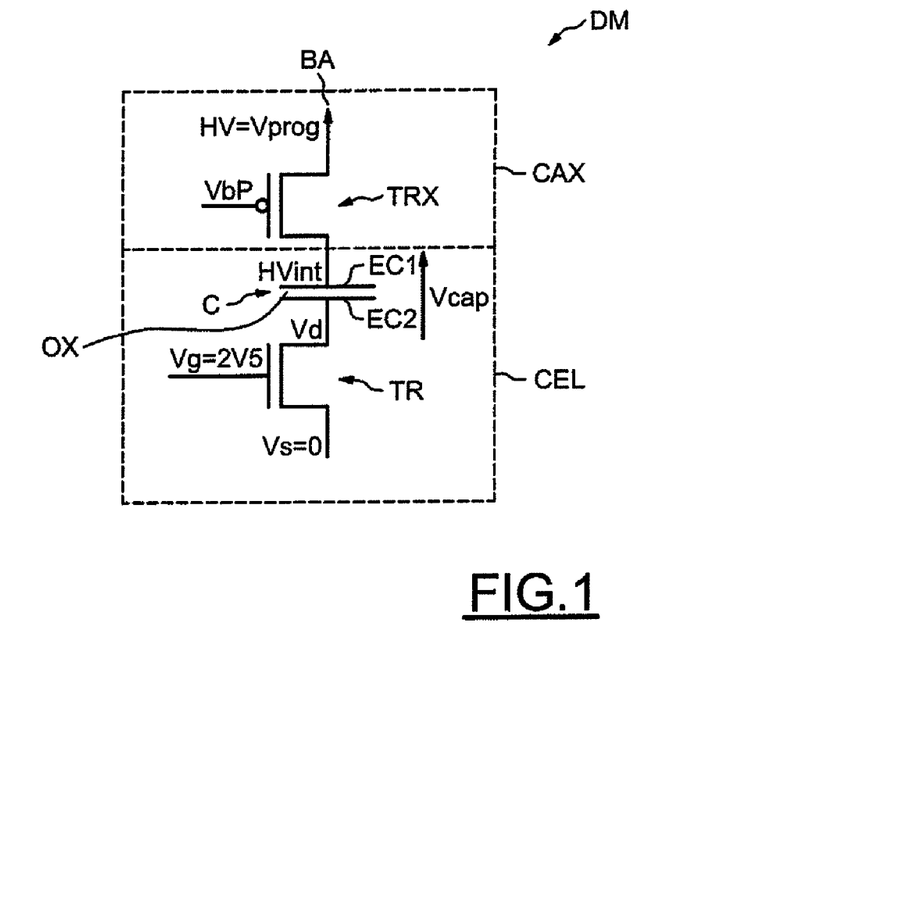
FIG. 1 diagrammatically illustrates a first embodiment of a memory cell equipped with an auxiliary circuit.

In FIG. 1, the reference CEL designates a memory cell of the "irreversible electric programming" type or else of the "one-time programmable" type, belonging to a memory device DM, embodied for example within an integrated circuit CI.

This cell CEL comprises a fusible dielectric zone C formed here of a capacitor possessing a dielectric OX flanked by a first electrode EC1 and a second electrode EC2.

The cell also comprises an access circuit comprising here a single access transistor TR which may be a bipolar transistor or else an MOS transistor, or else a transistor of the "field gradient" type. This the access circuit may also comprise for example two cascoded MOS transistors.

The first electrode EC1 of the capacitor is connected to a first power supply terminal BA by way of an auxiliary circuit CAX comprising here an auxiliary transistor TRX for example of the PMOS type.

The first power supply terminal, for example a level of metallization of the integrated circuit, is intended to be biased with a bias voltage HV which is equal to a programming voltage Vprog, for example of the order of 7 volts, in a programming mode.

In such a programming mode, the access transistor TR must be enabled, this being obtained for example by fixing its gate voltage at a value equal to 2.5 volts and by fixing its source voltage at a zero value.

In order to be able to apply the voltage Vprog to the first electrode EC1 of the capacitor C of the cell CEL which is to be programmed, the auxiliary transistor TRX is also enabled by applying a voltage VbP to its gate, so that the gate/source voltage of the transistor TRX is lower than its threshold voltage (for example of the order of −0.7 volts).

Moreover, the transistor TRX exhibits a saturation current $I_{sat}$ (TRX) that is lower than the saturation current $I_{sat}$ (CEL) of the access transistor TR of the cell CEL.

The person skilled in the art will be able to adjust the various parameters of the transistors as well as the various voltages to be applied in such a way as to obtain this condition between the saturation currents which is expressed by the following formula:

$$\mu_n \left(\frac{W}{L}\right)_n (V_{gsn} - V_{thn})^2 > \mu_p \left(\frac{W}{L}\right)_p (V_{gsp} - V_{thp})^2 \qquad (I)$$

in which $\mu_n$ denotes the mobility of the electrons of the transistor TR (NMOS transistor), $\mu_p$ denotes the mobility of the holes in the transistor TRX, $(W/L)_n$ denotes the ratio of the width to the length of the channel of the transistor TR, $W/L)_p$ denotes the ratio of the width to the length of the channel of the transistor TRX, $V_{thn}$ denotes the threshold voltage of the transistor TR, $V_{thp}$ denotes the threshold voltage of the transistor TRX, $V_{gsn}$ denotes the gate/source voltage difference of the transistor TR, and $V_{gsp}$ denotes the gate/source voltage difference of the transistor TRX.

Figure 2:
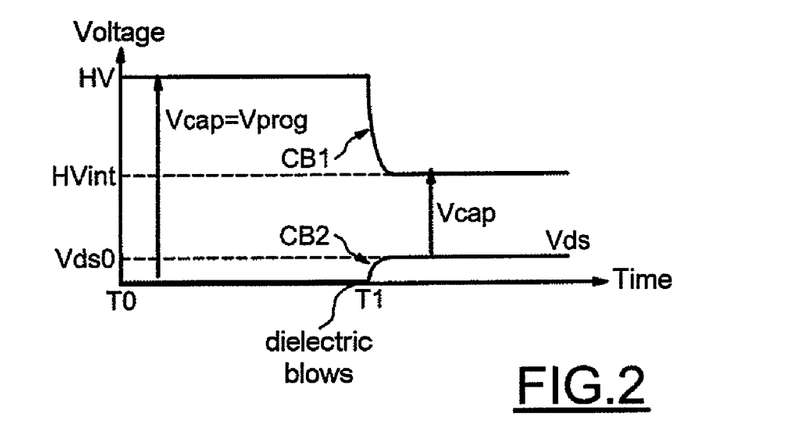
FIG. 2 illustrates variations of voltage in the memory device in the course of a programming operation.

By virtue of the presence of the transistor TRX and of the fact that the saturation current of this transistor TRX is lower than the saturation current of the access transistor TR, voltage movements of the type of those illustrated in FIG. 2 are obtained during programming.

In this FIG. 2, the curve CB1 illustrates the movement of the voltage at the drain of the transistor TRX, that is to say here on the first electrode EC1 of the capacitor C, whereas curve CB2 illustrates the movement of the drain voltage of the transistor TR, that is to say here the voltage on the second electrode EC2 of the capacitor C, or else the movement of the drain/source voltage Vds of the transistor TR since the source voltage of this transistor is equal to zero.

More precisely, at the instant T0, the programming voltage Vprog is applied to the power supply terminal BA. After a certain duration, which expires at the instant T1, the dielectric blows, that is to say it is irreversibly impaired by the occurrence of defects, which will give the dielectric a resistive value. This marks the actual programming of the cell CEL. The cell is then considered to be programmed with a logic "1" for example, whereas if the dielectric is not "blown", the cell remains programmed with a logic "0" for example.

When the dielectric OX blows, a resistive path is created between the power supply terminal BA and the ground, this being manifested as a drop in the voltage on the first electrode EC1 so as to reach the value HVint.

Moreover, the drain/source voltage Vds of the transistor TR increases and stabilizes at a value Vds0.

The difference between the values HVint and Vds0 is equal to the voltage difference Vcap across the terminals of the electrically blown capacitor.

Since the saturation current of the transistor TRX is lower than the saturation current of the transistor TR, the value Vds0 remains lower than the saturation value of this voltage and therefore lower than the nominal voltage. Therefore, the transistor TR works in a nominal span, thereby making it possible to ensure good reliability.

Moreover, as will be seen hereinbelow, the detection of the voltage drop at the level of the drain of the transistor TRX makes it possible to detect the instant of programming of the cell CEL.

Figure 3:
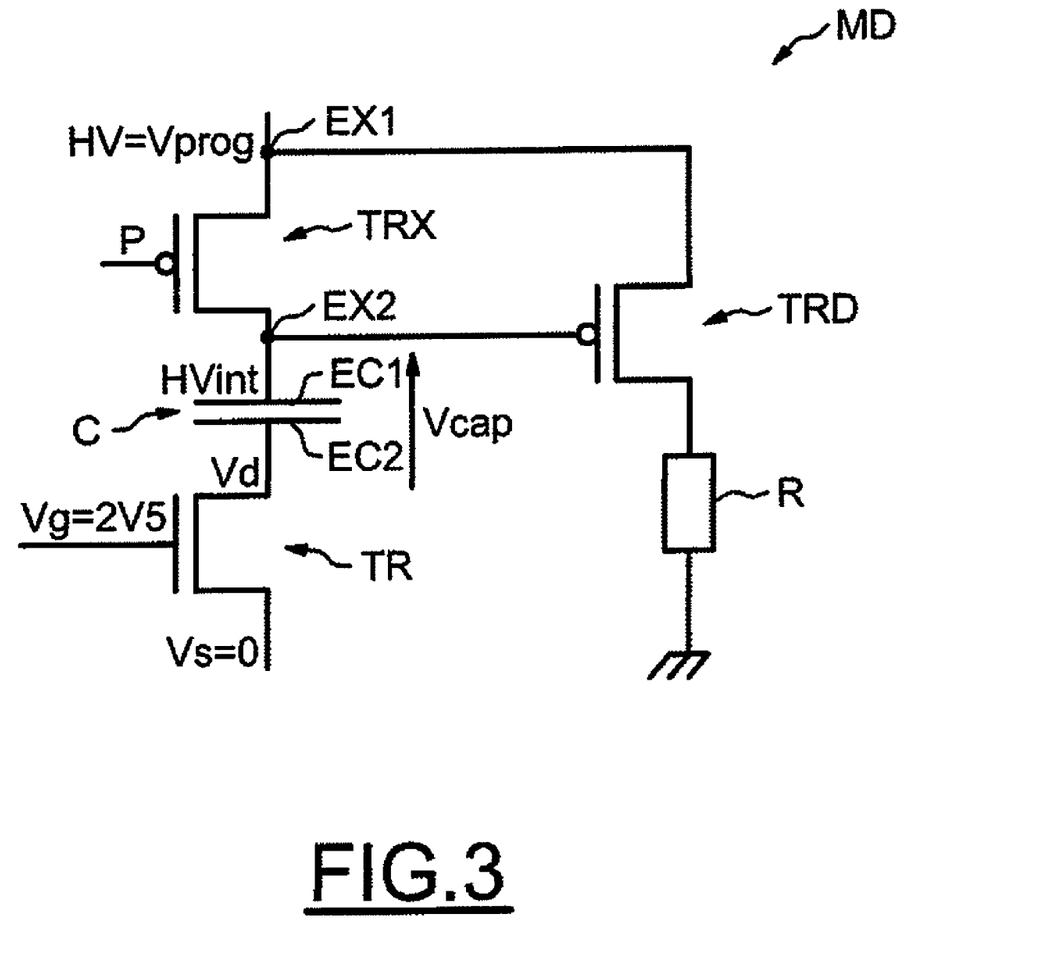
FIG. 3 illustrates diagrammatically an embodiment of a memory device according to the invention comprising means for detecting the programming of a memory cell.

FIG. 3 illustrates an embodiment of detection means MD making it possible to detect the actual programming of the memory cell, that is to say the degradation of the dielectric zone, by detecting more particularly the voltage drop at a spot situated between the auxiliary transistor TRX and the first electrode EC1.

More particularly, if the transistor TRX is considered to comprise a first auxiliary electrode EX1 intended to receive the programming voltage Vprog, and a second auxiliary electrode EX2 (in this instance the drain) coupled to the first electrode EC1, the detection means here comprise a transistor TRD, for example a PMOS transistor whose drain is linked to the first auxiliary electrode EX1 and therefore in fact to the first power supply terminal BA. The gate of the transistor TRD is linked to the second auxiliary electrode EX2 and the source of the transistor TRD is linked to ground by way of a resistor.

Thus, when a programming voltage Vprog, for example 7 volts, is applied to the dielectric zone of the capacitor of the cell across the auxiliary transistor TRX which is in its enabled state, this voltage Vprog is recovered on the gate of the transistor TRD as long as the dielectric zone has not been electrically blown.

On the other hand, as illustrated in FIG. 2, when this dielectric zone is electrically blown, there is a voltage drop at the level of the drain of the transistor TRX, this being manifested as a voltage drop at the level of the gate of the transistor TRD. The voltage HVint then becomes equal for example to 5 volts. Therefore, the gate/source voltage of the transistor TRD is lower than the threshold voltage of this transistor. The transistor TRD becomes enabled and this then results in a current in the resistor R that may be readily detected.

Of course, this embodiment is merely an example, and numerous variants are possible. It would for example be possible to replace the transistor TRD with a comparator receiving a reference voltage on its "minus" input, and having its "plus" input linked to the electrode EX2 of the transistor TRX.

Figure 4:
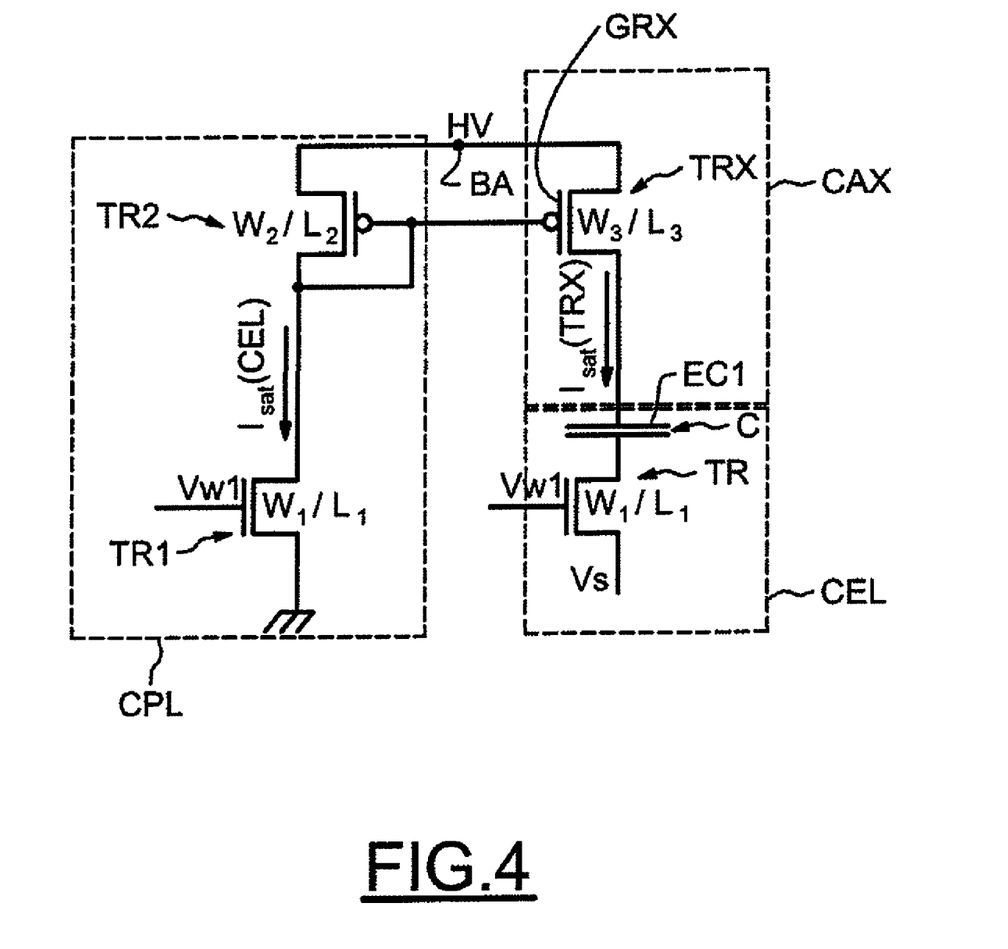
FIG. 4 diagrammatically illustrates another embodiment of a memory cell equipped with an auxiliary circuit.

The embodiment illustrated in FIG. 4 makes it possible to simply obtain an auxiliary transistor TRX exhibiting a lower saturation current than the saturation current of the access transistor TR of the cell CEL.

In this regard, provision is made to embody within the integrated circuit a bias circuit CPL electrically coupled to the auxiliary control electrode GRX (the gate) of the transistor TRX, this bias circuit CPL comprising a first transistor TRI identical to the access transistor, that is to say exhibiting a ratio $W_1/L_1$ identical to the ratio $W_1/L_1$ of the access transistor TR.

The bias circuit CPL furthermore comprises a second transistor TR2, in this instance a PMOS transistor, electrically coupled between the power supply terminal BA and the drain of the NMOS transistor TRI and forming a current mirror with the transistor TRX.

Moreover, the transistor TR2 is designed in such a way as to exhibit a greater ratio $W_2/L_2$ than the ratio $W_3/L_3$ of the auxiliary transistor TRX.

During a programming operation, the voltage Vw1 applied to the transistor TR1 enables the latter, thereby lowering the voltage applied to the gate of the transistor TRX, enabling it and allowing the programming of the cell CEL when the access transistor TR is itself enabled by application of the voltage Vw1. It should however be noted that the application of the voltage Vw1 to the transistor TR1 may be performed before the application of this voltage to the access transistor TR.

During this operation, an identical current flows through the transistors TR1 and TR2 (assuming that there is neither a gate current nor substrate current). The transistors TR1 and TR2 both operating in the saturation region, this identical current is equal to the saturation current of the transistor TR1 for example, that is to say to the saturation current $I_{sat}$ (CEL) of the transistor TR, since the transistors TR1 and TR are identical.

Moreover, the transistors TR2 and TRX of the current mirror have the same threshold voltage, the same mobility and the same gate/source voltage. However, since the ratio $W_2/L_2$ is greater than the ratio $W_3/L_3$, it follows that the saturation current of the transistor TR2 is greater than the saturation current $I_{sat}$ (TRX) of the auxiliary transistor TRX. Consequently, the saturation current of the transistor TRX is lower than the saturation current of the transistor TR2 and consequently of the transistor TR1 and consequently of the transistor TR.

Figure 5:
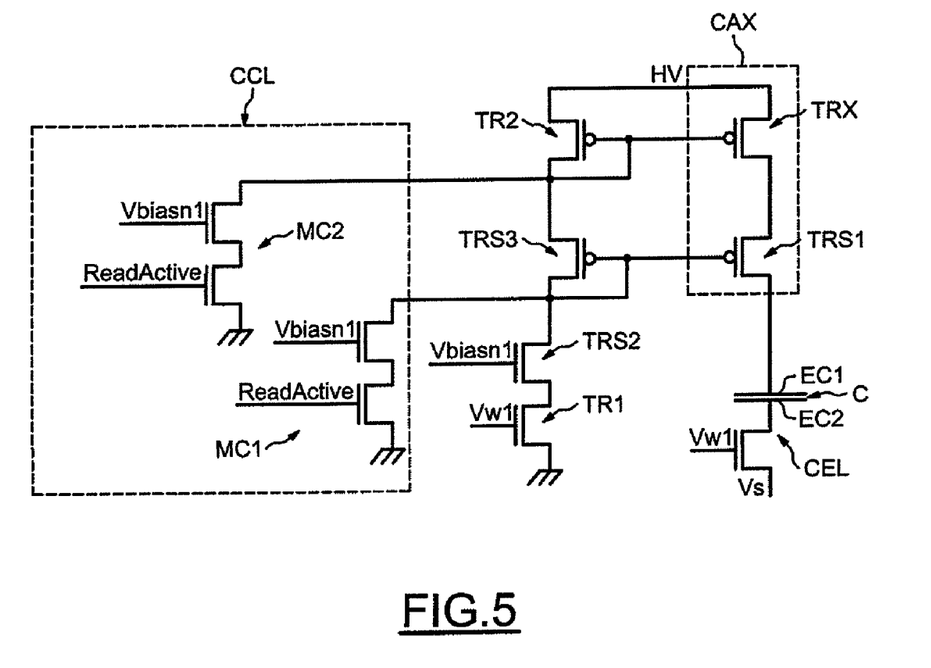
FIG. 5 illustrates yet another embodiment of a memory cell equipped with an auxiliary circuit.

In the embodiment illustrated in FIG. 5, the auxiliary circuit CAX comprises a first additional transistor TRS1, for example a PMOS transistor, electrically coupled between the transistor TRX and the electrode EC1 of the capacitor C, and forming with the transistor TRX a first cascode arrangement. This transistor TRS1 is associated with another transistor TRS3 so as together to form a current mirror. Moreover, a second additional transistor TRS2 is electrically coupled to the first transistor TR1 to form a second cascode arrangement.

These cascode arrangements make it possible to improve the reliability of the transistor TRX and of the transistor TR1. They also allow better precision in the copying of the currents.

Moreover, also represented in FIG. 5 are read control means CCL comprising two cascode arrangements MC1 and MC2, respectively coupled to the gates of the transistors TRX and TRS1. During the rising of the "read active" logic signal, the voltages of the gates of the transistors TRX and TRS1 are pulled towards ground, thus allowing these transistors to be enabled and thus allowing the reading of the cell CEL selected this time by applying a much lower read voltage HV, for example of the order of 2.5 volts. Vbiasn1 is chosen so as to enable the transistors receiving this voltage on their gate.

Figure 6:
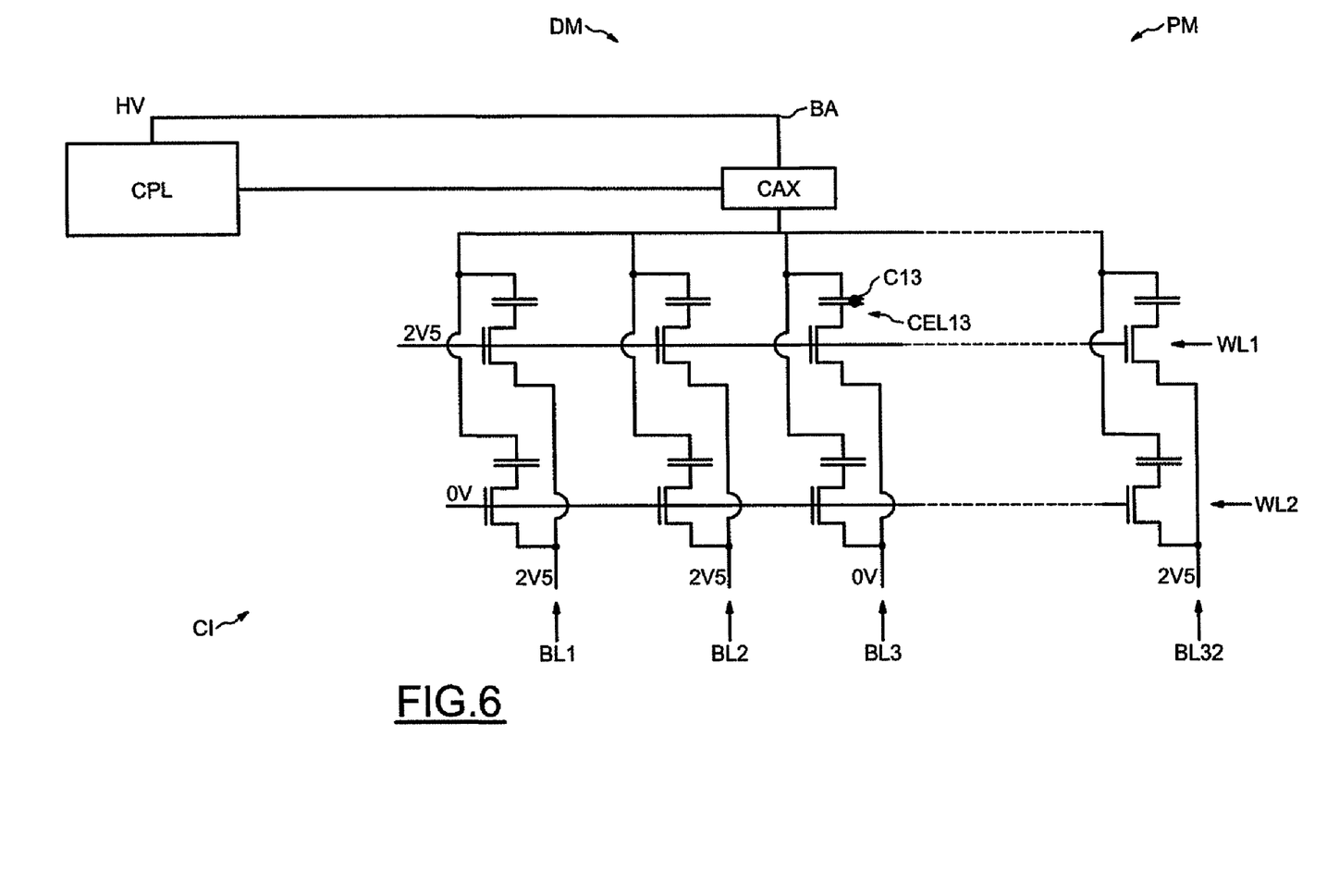
FIGS. 6 to 8 diagrammatically illustrate various exemplary organizations of memory planes equipped with one or more auxiliary circuits.

In FIG. 6 is represented a memory device DM comprising a memory plane PM composed of a matrix of memory cells.

This matrix comprises first sets of cells, for example rows of cells WLi. These rows form word lines of the memory. Moreover, the memory plane comprises second sets of cells, for example columns of cells BLi which form the bit lines of the memory.

In the architecture presented in FIG. 6, a single auxiliary circuit CAX and its associated bias circuit are connected between the power supply terminal BA and each of the columns of the memory plane. This therefore allows bitwise programming of the memory. By way of example, in FIG. 6, the cell CEL 13 is programmed with a logic "1" (blowing of the dielectric of the capacitor C13).

Figure 7:
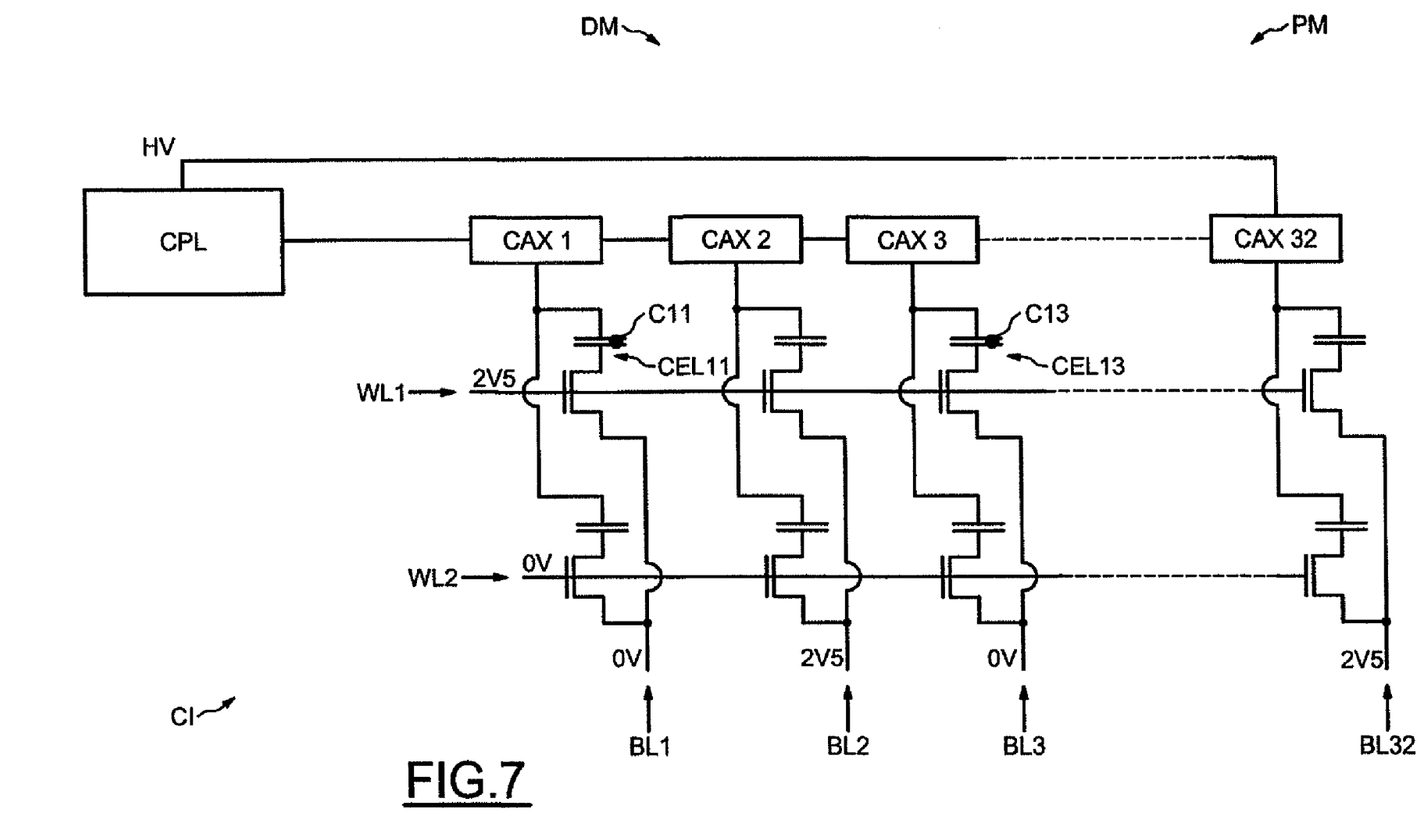

In the exemplary architecture of FIG. 7, an auxiliary circuit CAXi is associated with each of the columns of the memory. On the other hand, a single bias circuit CPL is common to all the auxiliary circuits CAXi.

This allows simultaneous programming of all the bits of a row of the memory. In the example of FIG. 7, the cells CEL 11 and CEL 13 are programmed with a logic "1" whereas the other cells of the row are programmed with "0s".

Figure 8:
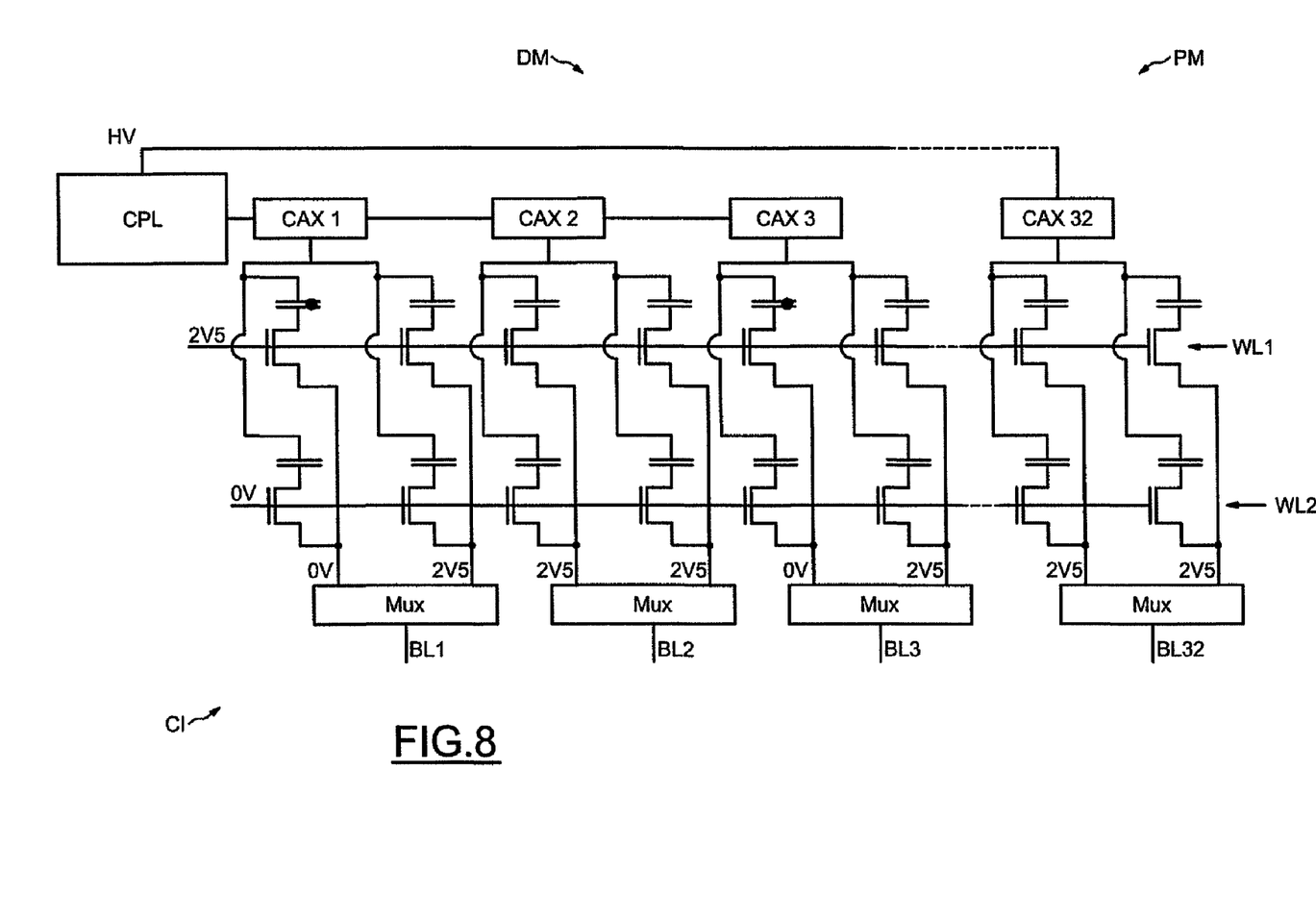

Finally, although it is possible to group the columns together into groups of 2n columns, with n greater than or equal to 1, the columns of the memory plane are, in FIG. 8, grouped together in pairs with, a multiplexer at the foot of each pair of columns. Also, an auxiliary circuit CAXi is associated with each pair of columns. Here again, a single bias circuit is associated with all the auxiliary circuits CAX1-CAX32. Such an architecture makes it possible to optimize the shape factor as well as the stray capacitance exhibited by the bit line. The memory reading time may thus be optimized.

The embodiments and modes of implementation just described have in particular the following advantages: improved reliability for the access transistors of the cells selected by programming, detection of possible programming, ease of design of the auxiliary circuits, significant surface density of the auxiliary circuits, possibility of directly adjusting the programming current, independently of the choice of the type of access transistor.

Finally, parallel programming and multiplexing of the columns are possible.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit comprising:

a memory cell of the irreversibly electrically programmable type comprising a dielectric zone disposed between a first electrode electrically coupled to a first power supply terminal and a second electrode electrically coupled to an access circuit including at least one access transistor;

an auxiliary circuit comprising an auxiliary transistor electrically coupled between the first electrode and the first power supply terminal, the auxiliary transistor having an auxiliary control electrode configured to enable the auxiliary transistor when the access transistor is also enabled, the auxiliary transistor configured to have a lower saturation current than a saturation current of the access transistor when both are enabled.

2. The integrated circuit according to claim 1, further comprising a detection circuit electrically coupled to the auxiliary transistor and operable during irreversible programming of said memory cell to detect a degradation of the dielectric zone of the memory cell during said irreversible programming of said memory cell and generate a signal indicative thereof.

3. The integrated circuit according to claim 2, wherein the auxiliary transistor comprises a first auxiliary electrode electrically coupled to said first power supply terminal and a second auxiliary electrode electrically coupled to the first electrode, and wherein the detection circuit is operable to sense a voltage variation at a node between the second auxiliary electrode and the first electrode during irreversible programming of said memory cell.

4. The integrated circuit according to claim 1, further comprising a bias circuit electrically coupled to the auxiliary control electrode, and comprising:

a first transistor identical to the access transistor;
a second transistor electrically coupled between the first transistor and the first power supply terminal and forming with the auxiliary transistor a current mirror;
wherein a ratio W/L of this second transistor is greater than a ratio W/L of the auxiliary transistor, W and L respectively designating a width and a length of a channel of the transistor.

5. The integrated circuit according to claim 4, wherein the auxiliary circuit further comprises a first additional transistor electrically coupled between the auxiliary transistor and the first electrode and forming with the auxiliary transistor a first cascode arrangement, and wherein the bias circuit further comprises a second additional transistor electrically coupled between the first transistor and the second transistor and forming with the first transistor a second cascode arrangement.

6. The integrated circuit according to claim 1, wherein the memory cell comprises a plurality of memory cells arranged in a memory plane comprising first sets of memory cells extending in a first direction and second sets of memory cells extending in a second direction, all the first electrodes of the memory cells being electrically coupled to the first power supply terminal, and wherein the auxiliary circuit is common to all the second sets of memory cells.

7. The integrated circuit according to claim 1, wherein the memory cell comprises a plurality of memory cells arranged in a memory plane comprising first sets of memory cells extending in a first direction and second sets of memory cells extending in a second direction, all the first electrodes of the memory cells being electrically coupled to the first power supply terminal, and wherein the auxiliary circuit comprises a plurality of auxiliary circuits with one auxiliary circuit per second set of memory cells, and a single bias circuit for all the auxiliary circuits.

8. The integrated circuit according to claim 1, wherein the memory cell comprises a plurality of memory cells arranged in a memory plane comprising first sets of memory cells extending in a first direction and second sets of memory cells extending in a second direction and distributed into groups of second sets, all the first electrodes of the memory cells being electrically coupled to the first power supply terminal, and wherein the auxiliary circuit comprises a plurality of auxiliary circuits with one auxiliary circuit per group of second sets of memory cells, and a single bias circuit for all the auxiliary circuits.

9. A method of programming a memory device of the irreversibly electrically programmable type which comprises at least one memory cell comprising a dielectric zone electrically coupled to an access circuit including at least one access transistor, the method comprising:
  applying a programming voltage to the dielectric zone across at least one auxiliary transistor in its enabled state; and
  sensing a degradation in the dielectric zone of the memory cell during irreversible programming of the memory cell by application of the programming voltage;
  wherein sensing comprises detecting a voltage variation at a node situated between the auxiliary transistor and the dielectric zone.

10. An integrated circuit, comprising:
  a capacitive structure including a first and second plates with a dielectric situated between the first and second plates;
  an access transistor having a conduction path connected in series with the capacitive structure at the second plate;
  an auxiliary transistor having a conduction path connected in series with the capacitive structure at the first plate; and
  a bias circuit operable to bias the auxiliary transistor to have a first saturation current that is less than a second saturation current for the access transistor when both transistors are enabled.

11. An integrated circuit comprising:
  a capacitive structure including a first and second plates with a dielectric situated between the first and second plates;
  an access transistor having a conduction path connected in series with the capacitive structure at the second plate;
  an auxiliary transistor having a conduction path connected in series with the capacitive structure at the first plate; and
  a bias circuit operable to bias the auxiliary transistor to have a first saturation current that is less than a second saturation current for the access transistor;
  wherein the bias circuit comprises a first transistor coupled to the auxiliary transistor in a current mirror configuration, and a second transistor coupled in series with the first transistor, that second transistor being identical to the access transistor in size and further sharing a common control voltage.

12. The integrated circuit of claim 11 further comprising a first cascode circuit connected to the first transistor and auxiliary transistor, the cascode circuit further having a current mirror configuration.

13. The integrated circuit of claim 11 further comprising a second cascode circuit connected to the second transistor.

14. The integrated circuit of claim 11 further comprising a voltage sensing circuit configured to sense a voltage at the first plate of the capacitive structure during programming and generate an indication responsive to damaging of the dielectric situated between the first and second plates.

15. An integrated circuit comprising:
  a memory cell of the irreversibly electrically programmable type comprising a dielectric zone disposed between a first electrode electrically coupled to a first power supply terminal and a second electrode electrically coupled to an access circuit including at least one access transistor;
  an auxiliary circuit comprising an auxiliary transistor electrically coupled between the first electrode and the first power supply terminal, the auxiliary transistor having an auxiliary control electrode configured to enable the auxiliary transistor when the access transistor is also enabled; and
  a detection circuit electrically coupled to the auxiliary transistor and operable during irreversible programming of said memory cell to detect occurrence of a degradation of the dielectric zone of the memory cell during said irreversible programming of said memory cell and generate a signal indicative thereof.

16. The integrated circuit according to claim 15, wherein the auxiliary transistor comprises a first auxiliary electrode electrically coupled to said first power supply terminal and a second auxiliary electrode electrically coupled to the first electrode, and wherein the detection circuit is operable to sense a voltage variation at a node between the second auxiliary electrode and the first electrode during irreversible programming of said memory cell.

17. The integrated circuit according to claim 15, further comprising a bias circuit electrically coupled to the auxiliary control electrode, and comprising:
  a first transistor;
  a second transistor electrically coupled between the first transistor and the first power supply terminal and forming with the auxiliary transistor a current mirror;
  wherein a ratio W/L of this second transistor is greater than a ratio W/L of the auxiliary transistor, W and L respectively designating a width and a length of a channel of the transistor.

18. The integrated circuit according to claim 17, wherein the auxiliary circuit further comprises a first additional transistor electrically coupled between the auxiliary transistor and the first electrode and forming with the auxiliary transistor a first cascode arrangement, and wherein the bias circuit further comprises a second additional transistor electrically coupled between the first transistor and the second transistor and forming with the first transistor a second cascode arrangement.

19. The integrated circuit according to claim 15, wherein the memory cell comprises a plurality of memory cells arranged in rows and columns of a memory plane, wherein all the first electrodes of the memory cells are electrically coupled to the first power supply terminal, and wherein the auxiliary circuit is common to all memory cells in a row.

20. The integrated circuit according to claim 15, wherein the memory cell comprises a plurality of memory cells arranged in a rows and columns of a memory plane, wherein all the first electrodes of the memory cells are electrically coupled to the first power supply terminal, and wherein the auxiliary circuit comprises a plurality of auxiliary circuits with one auxiliary circuit per row of memory cells, and a single bias circuit for all the auxiliary circuits.

21. The integrated circuit according to claim 15, wherein the memory cell comprises a plurality of memory cells arranged in rows and columns of a memory plane, the rows being distributed into groups of rows, wherein all the first electrodes of the memory cells are electrically coupled to the first power supply terminal, and wherein the auxiliary circuit comprises a plurality of auxiliary circuits with one auxiliary circuit per group of rows, and a single bias circuit for all the auxiliary circuits.

22. The integrated circuit according to claim 15, wherein the auxiliary transistor configured to have a lower saturation current than a saturation current of the access transistor when both are enabled.

23. An integrated circuit, comprising:
- a programmable capacitive structure including a first and second plates with a dielectric situated between the first and second plates;
- an access transistor having a conduction path connected in series with the capacitive structure at the second plate;
- an auxiliary transistor having a conduction path connected in series with the capacitive structure at the first plate; and
- a voltage sensing circuit configured to sense a voltage at the first plate of the capacitive structure during application of a programming voltage to the capacitive structure and generate an indication responsive to damaging of the dielectric situated between the first and second plates by that applied programming voltage.

* * * * *

UNITED STATES PATENT AND TRADEMARK OFFICE
CERTIFICATE OF CORRECTION

PATENT NO. : 7,978,502 B2  Page 1 of 1
APPLICATION NO. : 12/415299
DATED : July 12, 2011
INVENTOR(S) : Joël Damien It is certified that error appears in the above-identified patent and that said Letters Patent is hereby corrected as shown below:

At column 6, line number 18, please replace [TRI] with -- TR1 --.

At column 6, line number 25, please replace [TRI] with -- TR1 --.

At column 7, line number 34, please replace [CEL 11] with -- CEL11 --.

At column 7, line number 35, please replace [CEL 13] with -- CEL13 --.

Signed and Sealed this
Thirteenth Day of September, 2011

David J. Kappos
*Director of the United States Patent and Trademark Office*